US007671932B2

(12) United States Patent
Ohta et al.

(10) Patent No.: US 7,671,932 B2
(45) Date of Patent: Mar. 2, 2010

(54) ACTIVE MATRIX SUBSTRATE AND PIXEL DEFECT CORRECTING METHOD THEREFOR

(75) Inventors: Yasuyuki Ohta, Suzuka (JP); Masanori Takeuchi, Tsu (JP); Toshihide Tsubata, Tsu (JP)

(73) Assignee: Sharp Kabushiki Kaisha, Osaka (JP)

( * ) Notice: Subject to any disclaimer, the term of this patent is extended or adjusted under 35 U.S.C. 154(b) by 336 days.

(21) Appl. No.: 11/886,479

(22) PCT Filed: Feb. 21, 2006

(86) PCT No.: PCT/JP2006/302990

§ 371 (c)(1),
(2), (4) Date: Sep. 17, 2007

(87) PCT Pub. No.: WO2006/100861

PCT Pub. Date: Sep. 28, 2006

(65) Prior Publication Data

US 2009/0027582 A1    Jan. 29, 2009

(30) Foreign Application Priority Data

Mar. 18, 2005    (JP)    ............................ 2005-079394

(51) Int. Cl.
*G02F 1/1333*    (2006.01)
*G02F 1/1343*    (2006.01)
(52) U.S. Cl. ............................ 349/55; 349/54; 349/192
(58) Field of Classification Search .................. 349/54, 349/55, 144, 192; 345/93
See application file for complete search history.

(56) References Cited

U.S. PATENT DOCUMENTS

| 5,392,143 | A | * | 2/1995 | Akiyama et al. | ............... 349/55 |
| 5,943,106 | A | * | 8/1999 | Sukenori et al. | ............... 349/39 |
| 6,462,792 | B1 | * | 10/2002 | Ban et al. | ..................... 349/39 |

FOREIGN PATENT DOCUMENTS

| JP | 59-101693 | 6/1984 |
| JP | 02-135320 | 5/1990 |

(Continued)

OTHER PUBLICATIONS

International Search Report mailed Apr. 4, 2006 (Japanese and English Text).

*Primary Examiner*—Michael H Caley
(74) *Attorney, Agent, or Firm*—Nixon & Vanderhye, P.C.

(57) ABSTRACT

An active matrix substrate facilitates correction of a pixel defect and a pixel defect correcting method. A laser target portion of a drain electrode extension portion is irradiated with laser light so as electrically disconnect a TFT from a subpixel electrode. Laser target portions are irradiated with laser light so as to melt an insulating layer, thereby establishing electrical connection between a drain electrode extension portion and a corrective connecting electrode and between a data signal line ($13(m+1)$) and the corrective connecting electrode. Laser target portions are irradiated with laser light, thereby establishing electrical connection between a drain electrode extension portion of a pixel P(n+1, m) and a corrective connecting electrode and between the data signal line ($13(m+1)$) and the corrective connecting electrode. Laser target portions are irradiated with laser light so as to separate part of the data signal line ($13(m+1)$) and use the separated part of the data signal line ($13(m+1)$) as a detour conductor.

7 Claims, 10 Drawing Sheets

FOREIGN PATENT DOCUMENTS

| | | |
|---|---|---|
| JP | 04-347821 | 12/1992 |
| JP | 05-027262 | 2/1993 |
| JP | 08-328035 | 12/1996 |
| JP | 09-090318 | 4/1997 |
| JP | 10-133228 | 5/1998 |
| JP | 11-084421 | 3/1999 |
| JP | 2002-055361 | 2/2002 |
| JP | 2002-350901 | 12/2002 |
| JP | 2005-242306 | 9/2005 |

* cited by examiner

ACTIVE MATRIX SUBSTRATE AND PIXEL DEFECT CORRECTING METHOD THEREFOR

This application is the U.S. national phase of International Application No. PCT/JP2006/302990 filed Feb. 21, 2006 which designated the U.S. and claims priority to JP 2005-079394 filed Mar. 18, 2005, the entire contents of each of which are hereby incorporated by reference.

TECHNICAL FIELD

The present invention relates to active matrix substrates that can correct a pixel defect, and to a pixel defect correcting method.

BACKGROUND ART

In the manufacturing process of active matrix substrates, foreign particles, film residues, or the like, can cause a short circuit (source-drain leakage) between the source electrode and the drain electrode of a TFT or a short circuit (source-gate leakage) between the source electrode and the gate electrode thereof. Such leakage prevents a normal voltage (drain voltage) from being applied to the pixel electrode, resulting in the appearance of a pixel defect in the form of a white point or a black point, for example, on the display screen of a liquid crystal display device. This undesirably reduces the manufacturing yield of liquid crystal display devices.

To correct such a pixel defect, there have been proposed liquid crystal display devices provided with a corrective connecting conductor between adjacent pixels (see, for example, Patent Documents 1 to 4). According to these proposals, when a pixel defect occurs, a corrective connecting conductor is irradiated with laser light, for example, so that the pixel electrode of the defective pixel is electrically connected to the pixel electrode of the next pixel, whereby a voltage at the same potential as the next pixel is applied to the pixel electrode of the defective pixel. In this way, the defective pixel is driven in an analogous manner to the next pixel.

Patent Document 1: JP-A-S59-101693 (page 1)
Patent Document 2: JP-A-H02-135320 (pages 1 and 4, FIG. 1)
Patent Document 3: JP-A-H08-328035 (pages 1 and 5, FIG. 1)
Patent Document 4: JP-A-2002-350901 (pages 17 and 24, FIG. 20)

DISCLOSURE OF THE INVENTION

Problems to be Solved by the Invention

However, these proposed correcting methods require a corrective connecting conductor to be provided in such a way as to straddle the border between the pixels. This undesirably reduces the aperture ratio with an increase in the area of the corrective connecting conductor.

Additionally, in recent years, to reduce the dependence of γ characteristics on a viewing angle, a method of dividing one pixel into two or more subpixels and applying different voltages to the resultant subpixels has been increasingly adopted in liquid crystal display devices. With a conventional pixel defect correcting method, such a liquid crystal display device in which each pixel is provided with two or more subpixels cannot achieve satisfactory image quality.

In view of the conventionally experienced problems described above, an object of the present invention is to provide active matrix substrates and a pixel defect correcting method therefor that can easily and reliably correct a pixel defect without reducing the aperture ratio, the pixel defect caused by abnormalities such as source-drain leakage or source-gate leakage in a TFT portion due to foreign particles, film residues, or the like, in the active matrix substrate in which each pixel is provided with two or more subpixel electrodes, and that can improve yields of liquid crystal display devices.

Another object of the present invention is to provide a pixel defect correcting method that can easily and reliably correct a pixel defect without reducing image quality, the pixel defect caused by abnormalities in a TFT portion in an active matrix substrate in which each pixel is provided with two or more subpixel electrodes.

Means for Solving the Problem

Through an intensive study in search of a method for correcting a pixel defect without reducing display quality, the pixel defect caused mainly by abnormalities in a TFT portion in an active matrix substrate in which each pixel is provided with two or more subpixel electrodes, the inventors of the present invention have found out that, as compared with when all the subpixel electrodes of the defective pixel are corrected, when part of the subpixels of the defective pixel is corrected and the remainder thereof is left as a black point, the display quality is improved. The reason is considered to be as follows. Certainly, by correcting a defect by applying a voltage to all the subpixel electrodes of the defective pixel from the TFT of a subpixel adjacent thereto, it is possible to prevent the pixel from appearing as a black or white point. However, since the electrically connected subpixels are driven by the same drain voltage, the corrected subpixels are lit with timing different from their original lightning timing. Additionally, due to the imbalance in the capacitances of the subpixel electrodes, the drain voltage whose value is different from its original set value is applied. This may result in an unsatisfactory display quality despite of defect correction.

The present invention is based on the above findings. According to one aspect of the present invention, an active matrix substrate is provided with: a plurality of scanning signal lines and data signal lines formed on the substrate; thin-film transistors provided at intersections of the signal lines, the thin-film transistors each having a gate electrode connected to the scanning signal line and having a source electrode connected to the data signal line; and pixel electrodes each connected to a drain electrode or a drain lead-out conductor of one of the thin-film transistors. Here, the pixel electrodes are each provided with two or more subpixel electrodes to which different voltages can be applied. The data signal lines each have at least partially a double-track structure. A corrective connecting electrode is formed in a layer including the scanning signal line. Part of the corrective connecting electrode overlaps the data signal line via an insulating layer, and another part thereof overlaps the drain electrode or the drain lead-out conductor via the insulating layer.

Preferably, from a viewpoint of correcting a defective pixel without reducing the display quality, an identification mark for identifying a subpixel electrode of the two or more subpixel electrodes, the subpixel electrode to which the highest effective voltage is applied, is formed in the scanning signal line or in the data signal line within an area surrounded by lines of a double track of the data signal line.

Preferably, to identify a subpixel electrode to which the highest effective voltage is applied while preventing an increase in the resistance of the scanning signal line or the data signal line, a projection extending from the scanning signal line or the data signal line in the same plane is used as the identification mark.

According to another aspect of the present invention, a pixel defect correcting method corrects a pixel defect occurring in one of the active matrix substrates described above. Here, at least one subpixel electrode of a defective pixel and a subpixel electrode of a pixel next to the defective pixel are made to be at approximately the same potential by establishing electrical connection therebetween via the data signal line and the corrective connecting electrode, and the other subpixel of the defective pixel is left as a black point. Incidentally, for a normally black liquid crystal display device that blocks illuminating light when no voltage is applied to a pixel electrode, the subpixel is made to appear as a black point as follows. In a case of source-drain leakage, a drain lead-out conductor is cut so that no voltage is applied to the pixel electrode; in a case of source-gate leakage in the TFT portion, a branch of the gate or source of the TFT and the drain lead-out conductor are cut. On the other hand, for a normally white liquid crystal display device that allows illuminating light to pass therethrough when no voltage is applied to the pixel electrode, in a case of source-drain leakage, a defective pixel is left as it is without performing any correction; in a case of source-gate leakage in the TFT portion, a branch of the gate or source of the TFT is cut.

Preferably, from a viewpoint of improving the display quality, at least one subpixel electrode of a defective pixel and a subpixel electrode of a pixel next to the defective pixel, the subpixel electrode to which the highest effective voltage is applied, are made to be at approximately the same potential by establishing electrical connection therebetween.

By using the corrective connecting electrode, electrical connection is established as follows. A portion where the corrective connecting electrode and the data signal line overlap each other and a portion where the corrective connecting electrode and the drain electrode or the drain lead-out conductor overlap each other are melted by laser irradiation so as to establish electrical connection therebetween. Preferably, part of the data signal line electrically connected to the corrective connecting electrode is separated from the remainder of the data signal line.

ADVANTAGES OF THE INVENTION

According to the present invention, in an active matrix substrate, a pixel electrode is provided with two or more subpixel electrodes to which different voltages can be applied, a data signal line has at least partially a double-track structure, a corrective connecting electrode is formed in a layer including a scanning signal line, and part of the corrective connecting electrode is made to overlap the data signal line via an insulating layer, and the other part thereof is made to overlap a drain electrode or a drain lead-out conductor via the insulating layer. This makes it possible to easily and reliably correct a pixel defect caused by abnormalities such as source-drain leakage or source-gate leakage in a TFT portion without reducing the aperture ratio, and to improve yields of liquid crystal display devices.

According to the present invention, in a pixel defect correcting method for an active matrix substrate, part of subpixel electrodes of a defective pixel and a subpixel electrode of a pixel next to the defective pixel are made to be at approximately the same potential by establishing electrical connection therebetween via the data signal line and the corrective connecting electrode, and the other subpixel of the defective pixel is left as a black point. This helps improve the display quality as compared with when all the subpixels of the defective pixel are corrected.

LIST OF REFERENCE SYMBOLS 2a, 2a', 2b, 2b' Corrective connecting electrode
12 Scanning signal line
13 Data signal line
15 TFT (thin-film transistor)
21a Insulating layer
121, 131 Projection (identification mark)

BEST MODE FOR CARRYING OUT THE INVENTION

Hereinafter, an active matrix substrate according to the present invention and a pixel defect correcting method using the same will be described with reference to the accompanying drawings. However, the present invention is not limited to the embodiments specifically shown in these drawings. Unless otherwise noted, in this specification, a liquid crystal display device is assumed to be of a normally black type.

Figure 1:
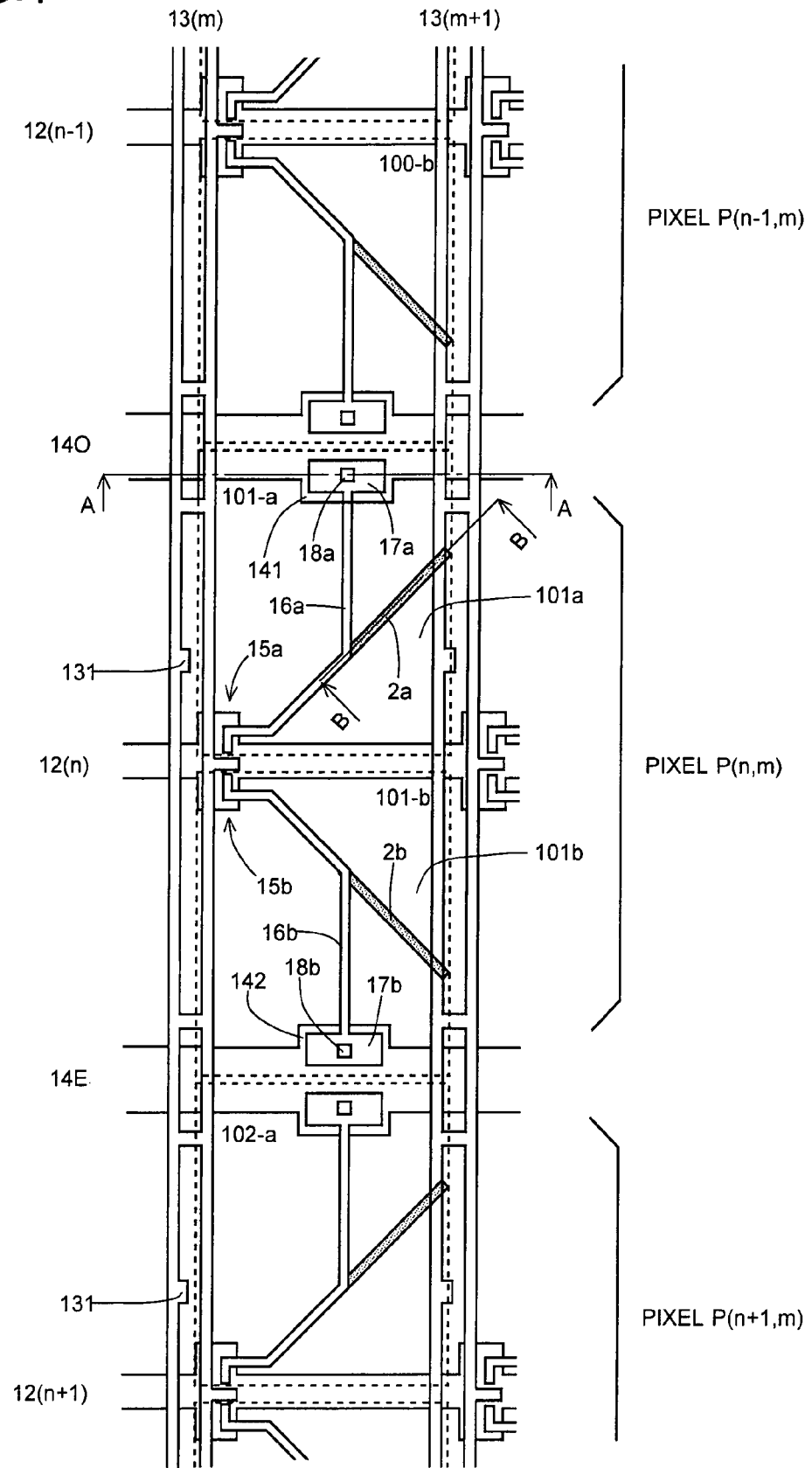
FIG. 1 A plan view showing an example of an active matrix substrate embodying the invention.
Figure 2:
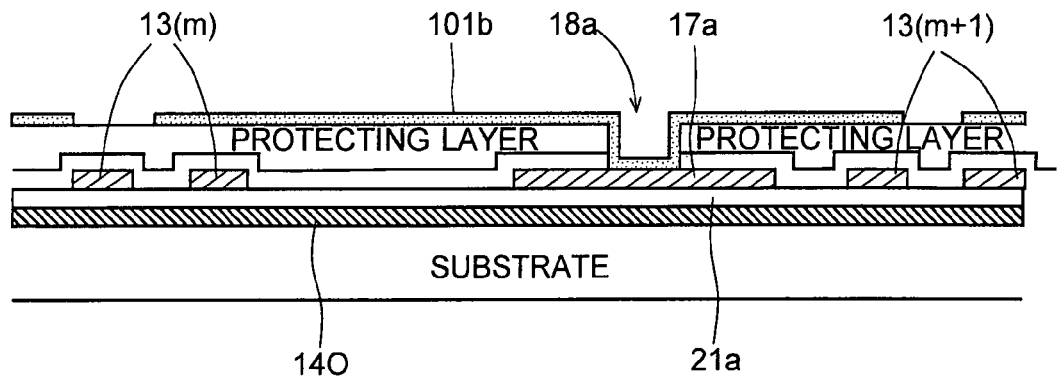
FIG. 2 A sectional view taken on the line A-A of FIG. 1.
Figure 3:
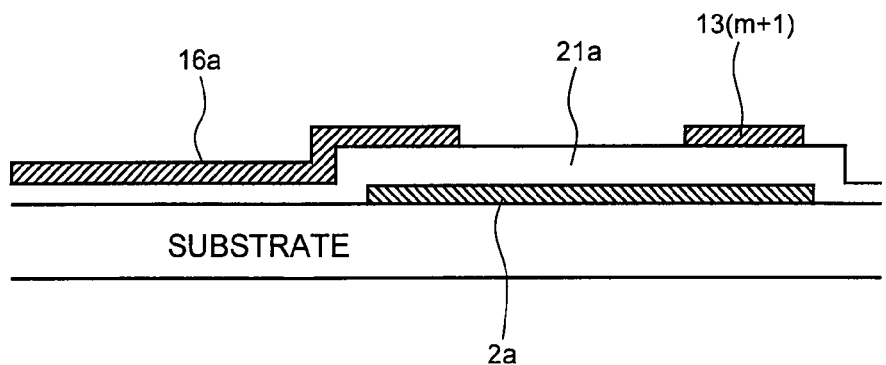
FIG. 3 A sectional view taken on the line B-B of FIG. 1.

FIG. 1 is a plan view schematically showing the pixel structure of the active matrix substrate embodying the invention, with respect to a pixel P(n, m) at row n and column m. FIGS. 2 and 3 are sectional views taken on the lines A-A and B-B, respectively, of FIG. 1. The pixel P(n, m) includes two subpixel electrodes 101a and 101b, which are arranged contiguously in the column direction. A scanning signal line 12(n) is laid between the pixels in the horizontal direction in this figure, and a data signal line 13(m) is laid between the pixels in the vertical direction in this figure. Two auxiliary capacitance conductors 14O and 14E are laid in such a way as to be parallel to the scanning signal line 12(n), and are arranged above the subpixel electrode 101a and below the subpixel electrode 101b, respectively. TFTs 15a and 15b serving as a switching element are formed near the intersection of the scanning signal line 12(n) and the data signal line 13(m).

A drain electrode extension portion 16a of the TFT 15a extends to the auxiliary capacitance conductor 14O, and overlaps it to form a portion facing an auxiliary capacitance common electrode 141, which is an integral part of the auxiliary capacitance conductor 14O, via an insulating layer 21a (shown in FIG. 2) and serving as an auxiliary capacitance electrode 17a. On this auxiliary capacitance electrode 17a, a contact hole 18a is formed, whereby the drain electrode extension portion 16a and the subpixel electrode 101a are connected to each other (see FIG. 2). Likewise, a drain electrode extension portion 16b extends to the auxiliary capacitance conductor 14E, and overlaps it to form a portion facing an auxiliary capacitance common electrode 142, which is an integral part of the auxiliary capacitance conductor 14E, via an insulating layer (not shown) and serving as an auxiliary capacitance electrode 17b. On this auxiliary capacitance electrode 17b, a contact hole 18b is formed, whereby the drain electrode extension portion 16b and the subpixel electrode 101b are connected to each other.

Here, the data signal line 13 has a so-called "ladder" shaped double-track structure. As will be described later, at the time of correction of a defective pixel, further improvement in the display quality can be achieved if a subpixel electrode of the defective pixel is at the same potential as one of subpixel electrodes of the next pixel, the one to which a higher effective voltage is applied. For this reason, it is preferable to put an identification mark so that a subpixel electrode to which a higher effective voltage is applied can be identified without actually applying a voltage. In this embodiment, since a higher effective voltage is applied to the subpixel electrode 101a, a projection (an identification mark) 131 is formed in a portion of the data signal line 13(m) located on one side of the subpixel electrode 101a.

Figure 4:
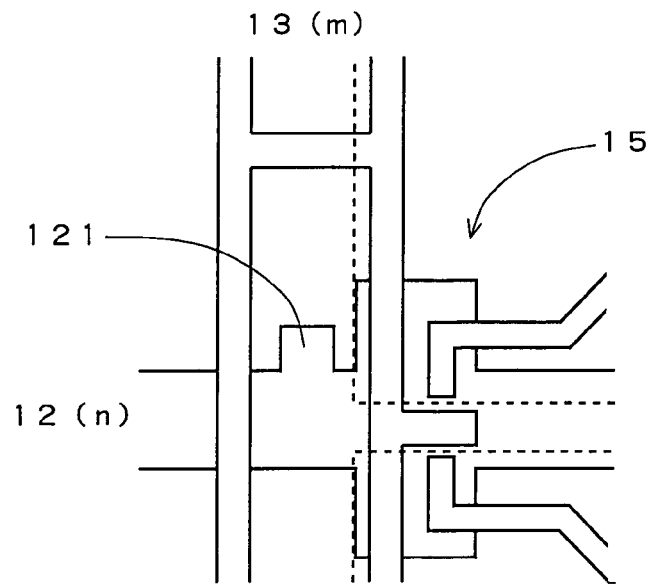
FIG. 4 A partially enlarged plan view showing another example of an identification mark.

Needless to say, since it is necessary simply to identify a subpixel electrode to which the highest effective voltage is applied, a projection may be instead formed on the side of the subpixel electrode 101b to which a lower effective voltage is applied. Alternatively, as shown in FIG. 4, a projection 121 may be formed in the scanning signal line 12. Instead, as an identification mark, any conventionally known identification mark such as a notch, a depression, or a printed mark may be formed in the signal line. However, a notch or a depression formed in the signal line as an identification mark may increase the resistance of the signal line, and thereby affect the display characteristics. On the other hand, a printed mark can disappear. It is for these reasons that a projection is preferable as an identification mark when used in combination with a ladder-shaped data signal line.

As shown in FIGS. 1 and 3, a corrective connecting electrode 2 is formed in a layer containing the scanning signal line 12(n). One end of the corrective connecting electrode 2 overlaps the drain electrode extension portion 16a via the insulating layer 21a, and the other end thereof overlaps a data signal line 13(m+1) via the insulating layer 21a. The reason that the corrective connecting electrode 2 and part of the drain electrode extension portion 16a are formed diagonally is that doing so makes them overlap a slit (not shown) formed in the subpixel electrodes 101a and 101b or a common electrode (not shown) for aligning a liquid crystal layer. This helps prevent a reduction in the aperture ratio of the liquid crystal display device.

As shown in FIG. 2, the auxiliary capacitance conductor 14O is formed below the contact hole 18a with the insulating layer 21a laid in between. This blocks light resulting from irregularities in the alignment of the liquid crystal layer, making it possible to improve the image quality. Incidentally, the insulating layer 21a forming an auxiliary capacitance is, for example, a gate insulating layer of a TFT.

Figure 5:
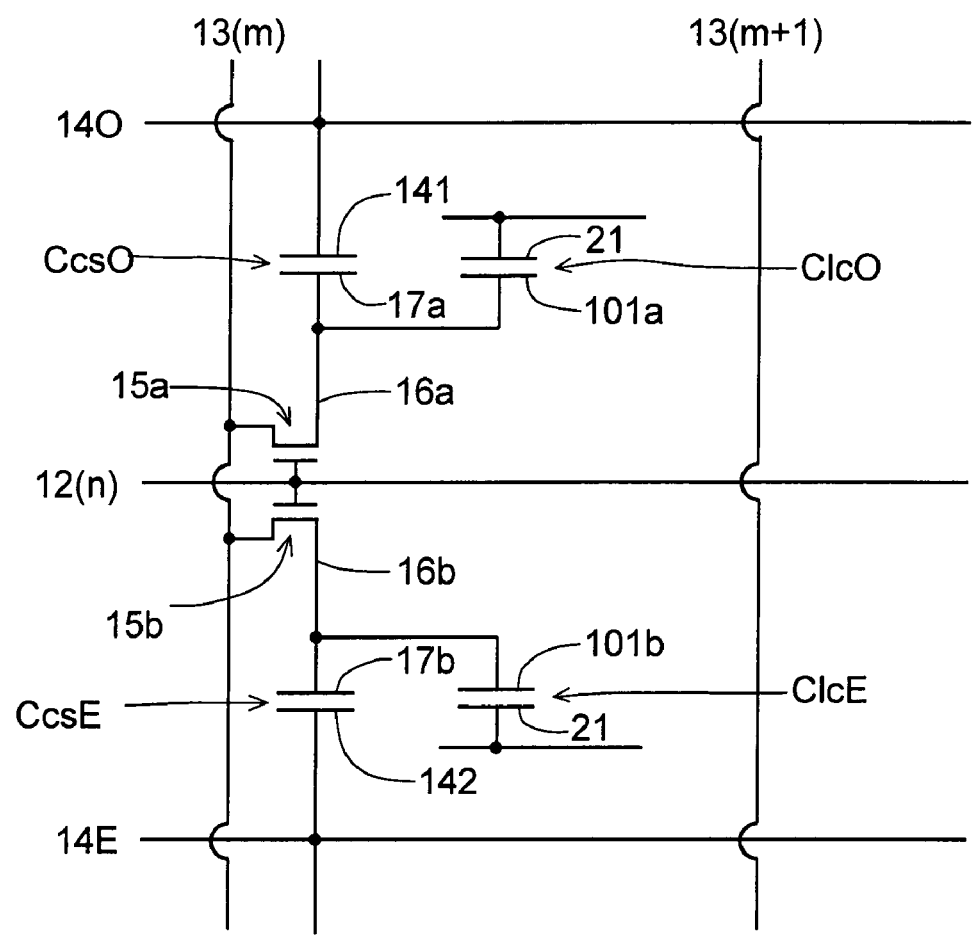
FIG. 5 A schematic diagram of an equivalent circuit of a liquid crystal display device using the substrate shown in FIG. 1.

FIG. 5 shows a schematic diagram of an equivalent circuit of the liquid crystal display device shown in FIG. 1. In this figure, a liquid crystal capacitance corresponding to a subpixel 101-a is represented by ClcO, and a liquid crystal capacitance corresponding to a subpixel 101-b is represented by ClcE. The liquid crystal capacitance ClcO of the subpixel 101-a is formed with the subpixel electrode 101a, the common electrode 21, and the liquid crystal layer laid between them, and the liquid crystal capacitance ClcE of the subpixel 101-b is formed with the subpixel electrode 101b, the common electrode 21, and the liquid crystal layer laid between them. The subpixel electrodes 101a and 101b are connected to the data signal line 13(m) via the TFTs 15a and 15b, respectively, and the gate electrodes G of the TFTs are connected to a common scanning signal line 12(n).

In FIG. 5, a first auxiliary capacitance formed for the subpixel 101-a and a second auxiliary capacitance formed for the subpixel 101-b are represented by CcsO and CcsE, respectively. The auxiliary capacitance electrode 17a of the first auxiliary capacitance CcsO is connected to the drain of the TFT 15a via the drain electrode extension portion 16a, and the auxiliary capacitance electrode 17b of the second auxiliary capacitance CcsE is connected to the drain of the TFT 15b via the drain electrode extension portion 16b. The points to which the auxiliary capacitance electrodes 17a and 17b are connected are not limited to those specifically shown in the figure, but may be otherwise as long as the auxiliary capacitance electrodes 17a and 17b are electrically connected to the subpixel electrodes 101a and 101b, respectively, so that they receive the same voltages applied to the subpixel electrodes 101a and 101b. That is, the subpixel electrodes 101a and 101b simply have to be connected, directly or indirectly, to the auxiliary capacitance electrodes 17a and 17b.

The auxiliary capacitance common electrode 141 of the first auxiliary capacitance CcsO is connected to the auxiliary capacitance conductor 14O, and the auxiliary capacitance common electrode 142 of the second auxiliary capacitance CcsE is connected to the auxiliary capacitance conductor 14E. With this configuration, it is possible to feed different auxiliary capacitance common voltages to the auxiliary capacitance common electrodes 141 and 142 of the first auxiliary capacitance CcsO and the second auxiliary capacitance CcsE. As will be described later, the connection relationship between the auxiliary capacitance common electrodes 141 and 142 and the auxiliary capacitance conductors 14O and 14E is appropriately selected depending on a driving method (such as dot inversion).

By feeding different auxiliary capacitance common voltages to the two auxiliary capacitance conductors 14O and 14E in this configuration, it is possible to make the effective voltage of the subpixel electrode 101a higher than that of the subpixel electrode 101b. This makes it possible to make the brightness of the subpixel 101-a higher than that of the subpixel 101-b. Different voltages can be applied to the subpixel electrode 101a and to the subpixel electrode 101b based on the following principle.

Figure 6:
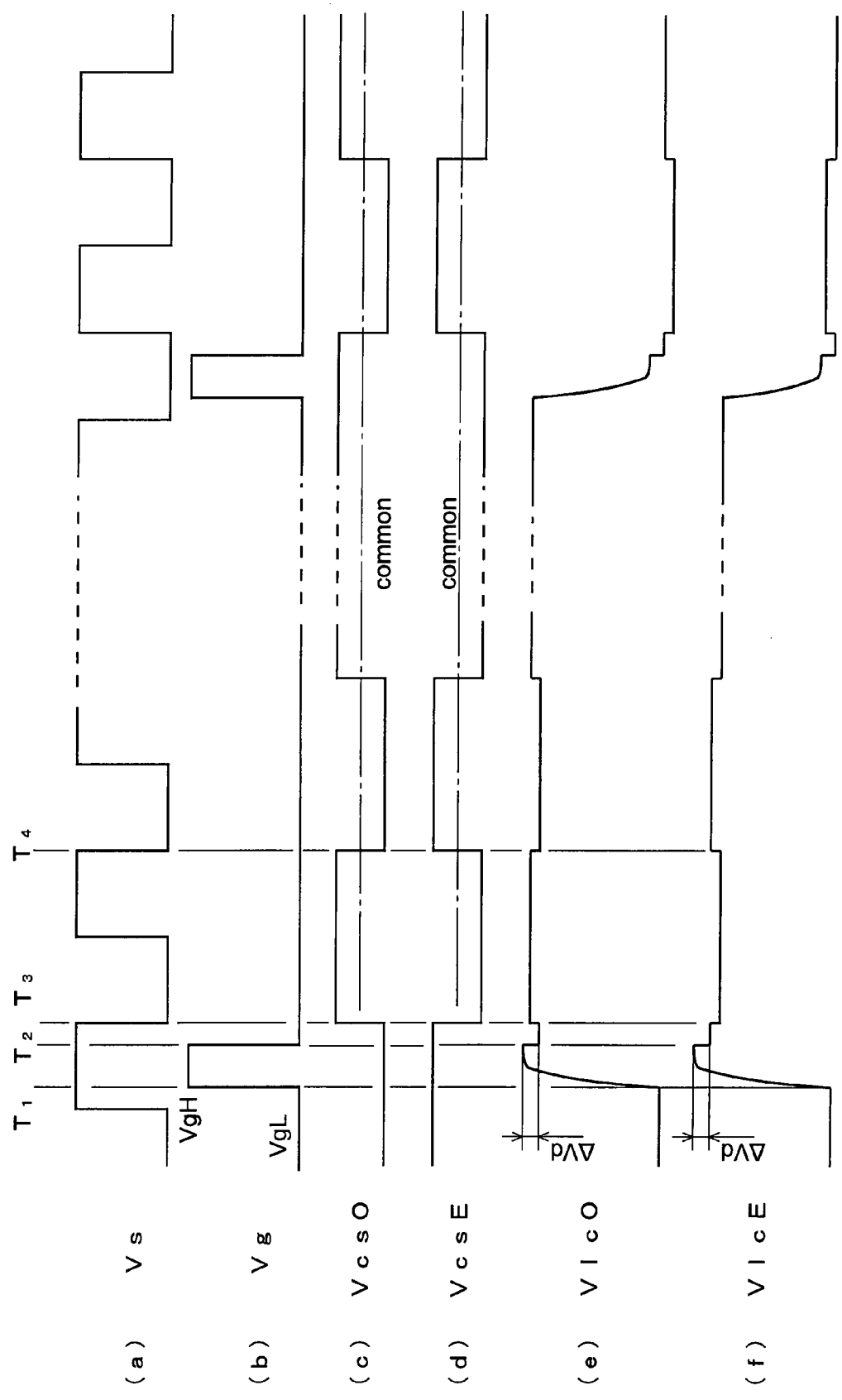
FIG. 6 An example of a waveform diagram showing voltages for driving the liquid crystal display device.

FIG. 6 shows voltage waveforms and timing of different signals inputted to the pixel P(n, m) shown in FIG. 5. Character (a) represents a waveform of a display signal voltage (gray-scale signal voltage) Vs fed to the data signal line 13. Character (b) represents a waveform of a scanning signal voltage Vg fed to the scanning signal line 12, and characters (c) and (d) represent waveforms of auxiliary capacitance common voltages (VcsO, VcsE) fed to the auxiliary capacitance conductors 14O and 14E, respectively. Characters (e) and (f) represent waveforms of voltages (VlcO, VlcE) applied to the liquid crystal capacitance ClcO of the subpixel 101-*a* and the liquid crystal capacitance ClcE of the subpixel 101-*b*, respectively.

A driving method shown in FIG. 6 is an embodiment of the present invention applied to a liquid crystal display device adopting 1 H dot inversion and frame inversion.

The display signal voltage Vs applied to the data signal line 13 is inverted every time one scanning signal line is selected (at intervals of a period of 1 H), and is opposite in polarity to the display signal voltage applied to the next signal line (1 H dot inversion). Also, the display signal voltages Vs applied to all the data signal lines 13 are inverted frame by frame (frame inversion).

In this example, the auxiliary capacitance common voltages VcsO and VcsE are inverted at intervals of a period of 2 H. The auxiliary capacitance common voltages VcsO and VcsE have waveforms with the same amplitude but shifted in phase by 180 degrees.

With reference to FIG. 6, the reason why the voltages (VlcO, VlcE) applied to the liquid crystal capacitance ClcO and to the liquid crystal capacitance ClcE behave as shown in FIG. 6 will be described.

At time $T_1$, the scanning signal voltage Vg is shifted from a low level (VgL) to a high level (VgH), so that the TFTs 15*a* and 15*b* are brought into conduction, whereby the display signal voltage Vs fed to the data signal line 13 is applied to the subpixel electrodes 101*a* and 101*b*. The voltage applied to both ends of the liquid crystal capacitances ClcO and ClcE equals a difference between the voltage at the subpixel electrodes 101*a* and 101*b* and the voltage (Vcom) at the common electrode 21, namely VlcO=VlcE=Vs−Vcom.

At time $T_2$, when the scanning signal voltage Vg is shifted from a high voltage VgH to a low voltage VgL (<Vs), the TFTs 15*a* and 15*b* are simultaneously brought into out of conduction (an OFF state), whereby all the subpixels and auxiliary capacitances are electrically disconnected from the data signal line 13. At the same time, due to the influences of, for example, the parasitic capacitance in the TFTs 15*a* and 15*b*, a so-called pull-in effect occurs, reducing the voltages at the subpixel electrodes 101*a* and 101*b* by ΔVd.

At time $T_3$, the voltage VlcO of the liquid crystal capacitance ClcO changes under the influence of the voltage VcsO at the auxiliary capacitance common electrode 141 of the auxiliary capacitance CcsO electrically connected to the subpixel electrode 101*a* forming the liquid crystal capacitance ClcO; the voltage VlcE of the liquid crystal capacitance ClcE changes under the influence of the voltage VcsE at the auxiliary capacitance common electrode 142 of the auxiliary capacitance CcsE electrically connected to the subpixel electrode 101*b* forming the liquid crystal capacitance ClcE.

Here, suppose that, at time $T_3$, the auxiliary capacitance common voltage VcsO increases by VcsOp>0, and the auxiliary capacitance common voltage VcsE decreases by VcsEp>0. That is, let the total amplitude (Vp-p) of the auxiliary capacitance common voltage VcsO be VcsOp, and the total amplitude of the auxiliary capacitance common voltage VcsE be VcsEp.

Let the total capacitance of the liquid crystal capacitance ClcO and the auxiliary capacitance CcsO be $C_{pix}O$, and the total capacitance of the liquid crystal capacitance ClcE and the auxiliary capacitance CcsE be $C_{pix}E$. Then, $$VlcO=Vs-\Delta Vd+VcsOp(CcsO/C_{pix}O)-Vcom,$$

$$VlcE=Vs-\Delta Vd-VcsEp(CcsE/C_{pix}E)-Vcom.$$

Next, at time $T_4$, VlcO and VlcE are turned back to the voltage values observed at time $T_2$ once again under the influence of the voltages VcsO and VcsE at the auxiliary capacitance common electrodes.

$$VlcO=Vs-\Delta Vd-Vcom$$

$$VlcE=Vs-\Delta Vd-Vcom$$

This voltage change is repeated until Vg(n) becomes VgH in the next frame. As a result, VlcO and VlcE are given different effective values. That is, let the effective value of VlcO be $VlcO_{rms}$, and the effective value of VlcE be $VlcE_{rms}$. Then, $$VlcO_{rms}=Vs-\Delta Vd+(\frac{1}{2})VcsOp(CcsO/C_{pix}O)-Vcom,$$

$$VlcE_{rms}=Vs-\Delta Vd-(\frac{1}{2})VcsEp(CcsE/C_{pix}E)-Vcom$$

(when $(Vs-\Delta Vd-Vcom) \gg VcsOp(CcsO/C_{pix}O)$ and $(Vs-\Delta Vd-Vcom) \gg VcsEp(CcsE/C_{pix}E)$).

Thus, let a difference between these effective values be $\Delta Vlc=VlcO_{rms}-VlcE_{rms}$. Then, $\Delta Vlc=\{VcsOp(CcsO/C_{pix}O)+VcsEp(CcsE/C_{pix}E)\}/2$. As described above, by controlling the voltages applied to the auxiliary capacitance common electrodes 141 and 142 of the auxiliary capacitances CcsO and CcsE respectively connected to the subpixel electrodes 101*a* and 101*b*, it is possible to apply different voltages to the subpixel electrode 101*a* and the subpixel electrode 101*b*.

Alternatively, by giving VcsO a voltage value of VcsE and giving VcsE a voltage value of VcsO, it is possible to make smaller the effective value of VlcO and make greater the effective value of VlcE. Instead, by connecting the auxiliary capacitance conductor 14O to the auxiliary capacitance common electrode 142 of the auxiliary capacitance CcsE and connecting the auxiliary capacitance conductor 14E to the auxiliary capacitance common electrode 141 of the auxiliary capacitance CcsO, it is also possible to make smaller the effective value of VlcO and make greater the effective value of VlcE.

Here, since frame inversion driving is performed, the polarity of Vs is inverted in the next frame, and Vlc<0. In this case, by inverting the polarities of VcsO and VcsE in synchronism therewith, it is possible to achieve the same effects as in the case described above.

In the active matrix substrate configured as described above, if a pixel defect occurs as a result of source-drain leakage, source-gate leakage, or the like, due to foreign particles or film residues, for example, in the TFT portion of the pixel P, and is left uncorrected, the pixel P appears as a white point. This causes the substrate to be rejected as a defective. To avoid this, correction is made by applying a drain voltage to part of the subpixels of the pixel P from the next pixel.

Figure 7:
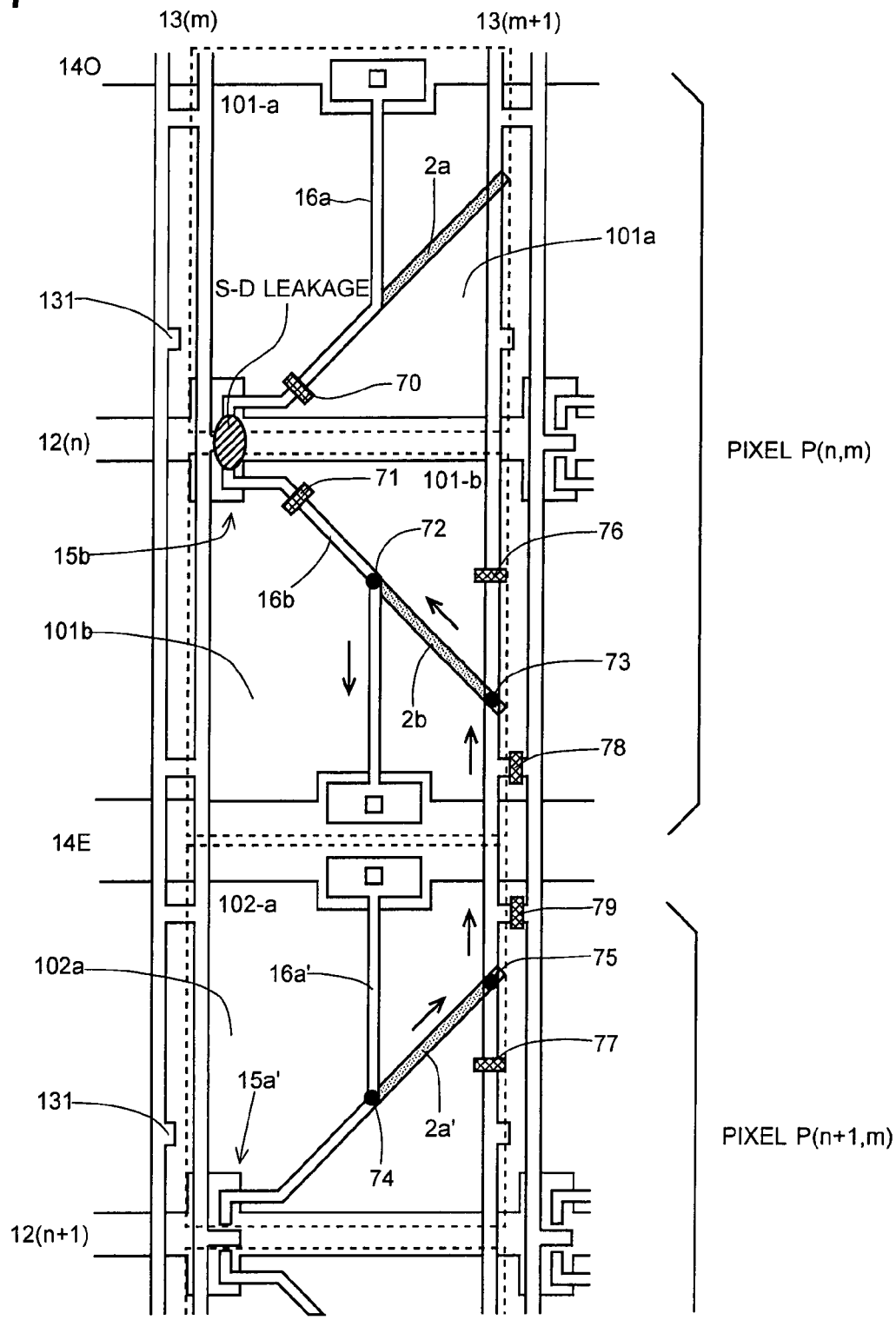
FIG. 7 A plan view showing an example of correction made to the substrate shown in FIG. 1.

FIG. 7 shows an example of a correcting method. The correcting method shown in FIG. 7 is adopted when a pixel defect occurs due to source-drain leakage in the TFT portion of the pixel P(n, m). In this example, a subpixel electrode (a "bright" electrode) 102*a* of a pixel P(n+1, m) arranged below the defective pixel P(n, m) and the subpixel 101*b* of the defective pixel P(n, m) are made to be at approximately the same potential by means of the corrective connecting electrodes 2*a*' and 2*b*, and the other subpixel of the defective pixel P(n, m), namely the subpixel 101-*a* is left as a black point. A specific correcting method is as follows.

Figure 8:
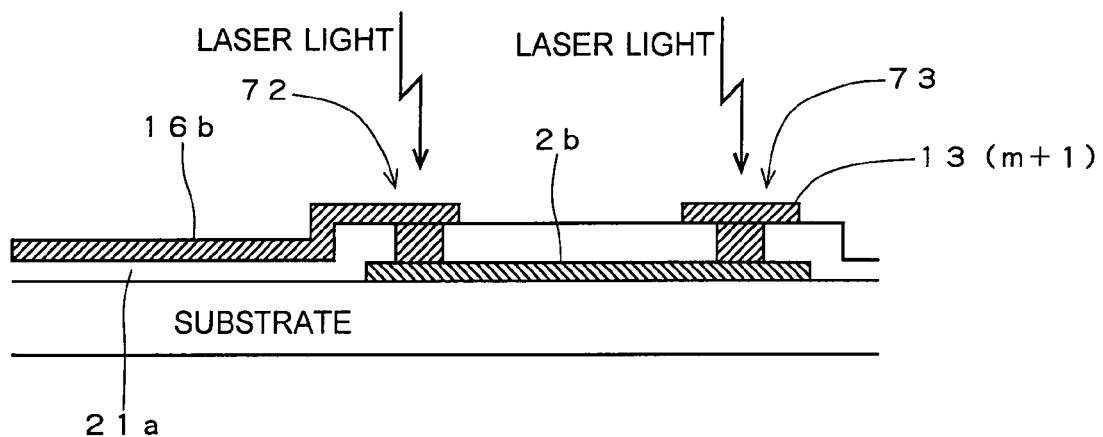
FIG. 8 An outline diagram showing how to electrically connect a corrective connecting electrode to the drain electrode and to the data signal line.

A laser target portion 71 of the drain electrode extension portion 16*b* is irradiated with laser light from the front or back of the substrate so as to electrically disconnect the TFT 15*b* affected by abnormalities from the subpixel electrode 101*b*. Then, as shown in FIG. 8, laser target portions 72 and 73 are irradiated with laser light so as to melt the insulating layer 21a, thereby establishing electrical connection between the drain electrode extension portion 16b and the corrective connecting electrode 2b and between the data signal line 13(m+1) and the corrective connecting electrode 2b. Likewise, laser target portions 74 and 75 are irradiated with laser light, thereby establishing electrical connection between the drain electrode extension portion 16a' of the pixel P(n+1, m) and the corrective connecting electrode 2a' and between the data signal line 13(m+1) and the corrective connecting electrode 2a'. Then, laser target portions 76 to 79 are irradiated with laser light so as to separate part of the data signal line 13(m+1) and use the separated part of the data signal line 13(m+1) as a detour conductor.

On the other hand, a laser target portion 70 of the drain electrode extension portion 16a is irradiated with laser light so as to electrically disconnect the TFT 15b from the subpixel electrode 101a, whereby the subpixel 101-a is left as a black point.

In the correcting method here, any conventionally known laser can be used, examples including a YAG laser (wavelength: 266 nm and 532 nm). Different types of lasers may be used appropriately in accordance with the intended use, such as cutting an electrode or melting an insulating layer.

As described above, by forming a detour shown in FIG. 7 (indicated by arrows in the figure), the drain voltage applied to the subpixel electrode 102a of the pixel P(n+1, m) is applied also to the subpixel electrode 101b of the defective pixel P(n, m). As a result, the subpixel 101-b is made to perform the same display operation as the subpixel 102-a, and is given substantially the same brightness as the subpixel 102-a. This helps improve the display quality. As will be described below, it has been theoretically proved that the brightness of the subpixel 101-b is substantially the same as that of the subpixel 102-a.

Figure 9:
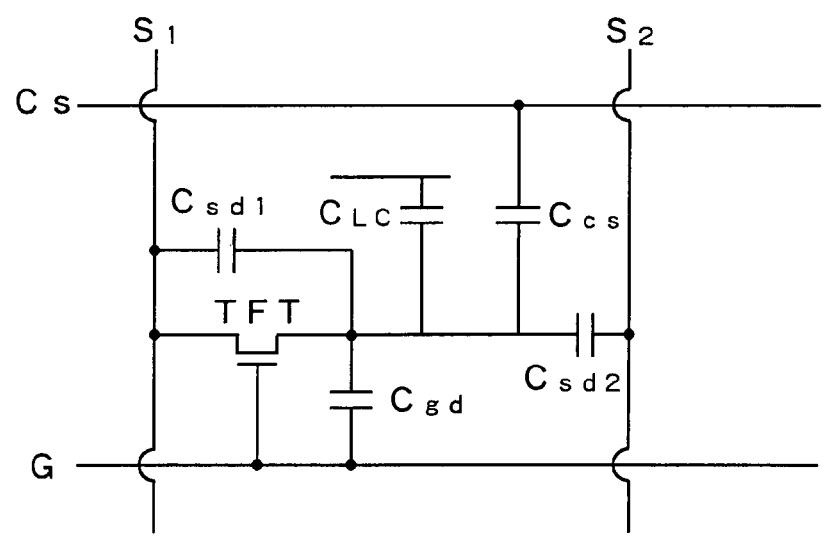
FIG. 9 A diagram showing the capacitance of a subpixel.

With reference to FIG. 9, the total capacitance $C_{pix}$ of a subpixel before correction is given by $$C_{pix}=C_{LC}+C_{Cs}+C_{sd}+C_{gd}$$

where $C_{sd}=C_{sd1}+C_{sd2}$, $C_{sd1}$ being the capacitance of a data signal line of a pixel to which it belongs, the data signal line laid within a subpixel electrode region, and $C_{sd2}$ being the capacitance of a data signal line of the other pixel, the data signal line laid within the subpixel electrode region.

After correction is performed, since the area of the subpixel is doubled, and the subpixel is driven by one TFT, the total capacitance $C'_{pix}$ is given by $$C'_{pix}=2C_{LC}+2C_{Cs}+2C_{sd}+C_{gd}.$$

In general, $C_{gd}$ is a few percent of $C_{pix}$. Therefore, $C'_{pix}$ can be regarded as twice as large as $C_{pix}$.

Here, the pull-in voltage $\Delta V_d$ at the drain before correction is given by $$\Delta V_d=(C_{gd}/C_{pix})\times V_{gpp}$$

where $V_{gpp}$ is the amplitude of the gate voltage. On the other hand, the pull-in voltage $\Delta V_d'$ after correction is given by $\Delta V_d'=(C_{gd}/C'_{pix})\times V_{gpp}$. Thus, the pull-in voltage $\Delta V_d'$ after correction is a half of the voltage $\Delta V_d$ before correction.

The amount of change $\Delta V_{cs}$ in the drain voltage caused by the auxiliary capacitance voltage $V_{cs}$ before correction is given by $$\Delta V_{cs}=(C_{cs}/C_{pix})\times V_{cspp}$$

where $V_{cspp}$ is the amplitude of the auxiliary capacitance voltage. On the other hand, since $C_{cs}$ after correction is twice as large as that before correction, the amount of voltage change $\Delta V'_{cs}$ after correction is given by $\Delta V'_{cs}=(2\,C_{cs}/C'_{pix})\times V_{cspp}$. Thus, the amount of voltage change $\Delta V'_{cs}$ after correction is substantially the same as that before correction.

As described above, the only change in the drain voltage caused by pixel correction is that the pull-in voltage $\Delta V_d$ is reduced in half. Thus, even after correction, the brightness of the pixel is substantially the same.

Figure 10:
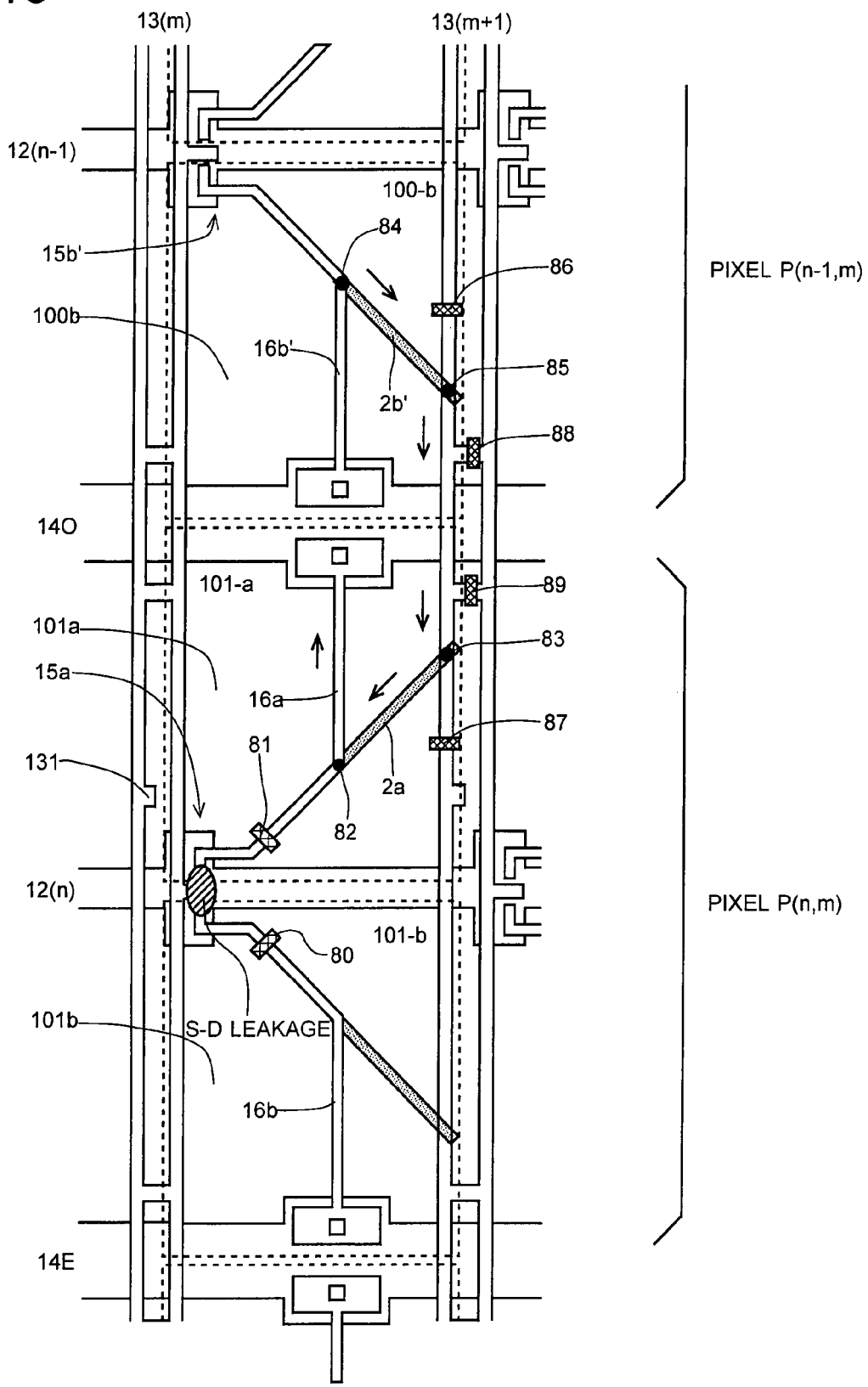
FIG. 10 A plan view showing another example of correction made to the substrate shown in FIG. 1.

FIG. 10 shows another example of a pixel correcting method. As is the case with the correcting method described above, the correcting method shown in FIG. 10 is adopted when a pixel defect occurs due to source-drain leakage in the TFT portion of the pixel P(n, m); it differs from the correcting method described above in that a subpixel electrode (a "dark" electrode) 100b of a pixel P(n−1, m) arranged above the defective pixel P(n, m) and the subpixel 101a of the defective pixel P(n, m) are made to be at approximately the same potential by means of the corrective connecting electrodes 2b' and 2a.

The specific correction procedure is the same as that described above, and therefore only an outline thereof will be described. A laser target portion 81 of the drain electrode extension portion 16a is irradiated with laser light so as to electrically disconnect the TFT 15a affected by abnormalities from the subpixel electrode 101a. Then, laser target portions 82 and 83 are irradiated with laser light, thereby establishing electrical connection between the drain electrode extension portion 16a and the corrective connecting electrode 2a and between the data signal line 13(m+1) and the corrective connecting electrode 2a. Likewise, laser target portions 84 and 85 are irradiated with laser light, thereby establishing electrical connection between the drain electrode extension portion 16b' of the pixel P(n−1, m) and the corrective connecting electrode 2b' and between the data signal line 13(m+1) and the corrective connecting electrode 2b'. Furthermore, laser target portions 86 to 89 are irradiated with laser light so as to separate part of the data signal line 13(m+1) and use the separated part of the data signal line 13(m+1) as a detour conductor.

As described above, by forming a detour shown in FIG. 10 (indicated by arrows in the figure), the drain voltage applied to the subpixel electrode 100b of the pixel P(n−1, m) is applied also to the subpixel electrode 101a of the defective pixel P(n, m). As a result, the subpixel 101-a is made to perform the same display operation as the subpixel 100-b, and is given substantially the same brightness as the subpixel 100-b. This helps improve the display quality.

Incidentally, as compared with when the drain voltage at a lower effective voltage side of the next pixel is applied to the subpixel electrode of the defective pixel (a correcting method shown in FIG. 10), when the drain voltage at a higher effective voltage side of the next pixel is applied thereto (a correcting method shown in FIG. 7), better display quality is obtained. That is, as compared with when the corrected defective pixel is composed of a "dark" subpixel and a black point, when it is composed of a "bright" subpixel and a black point, better display quality is obtained. After the assembly of the liquid crystal panel, a subpixel electrode to which the highest effective voltage is applied can be identified by illuminating the liquid crystal panel. However, it is impossible to illuminate the liquid crystal panel in the manufacturing process of the substrate. For this reason, as described above, it is necessary to form a projection (an identification mark) 131 in the substrate for easy identification of a subpixel electrode to which the highest effective voltage is applied.

Figure 11:
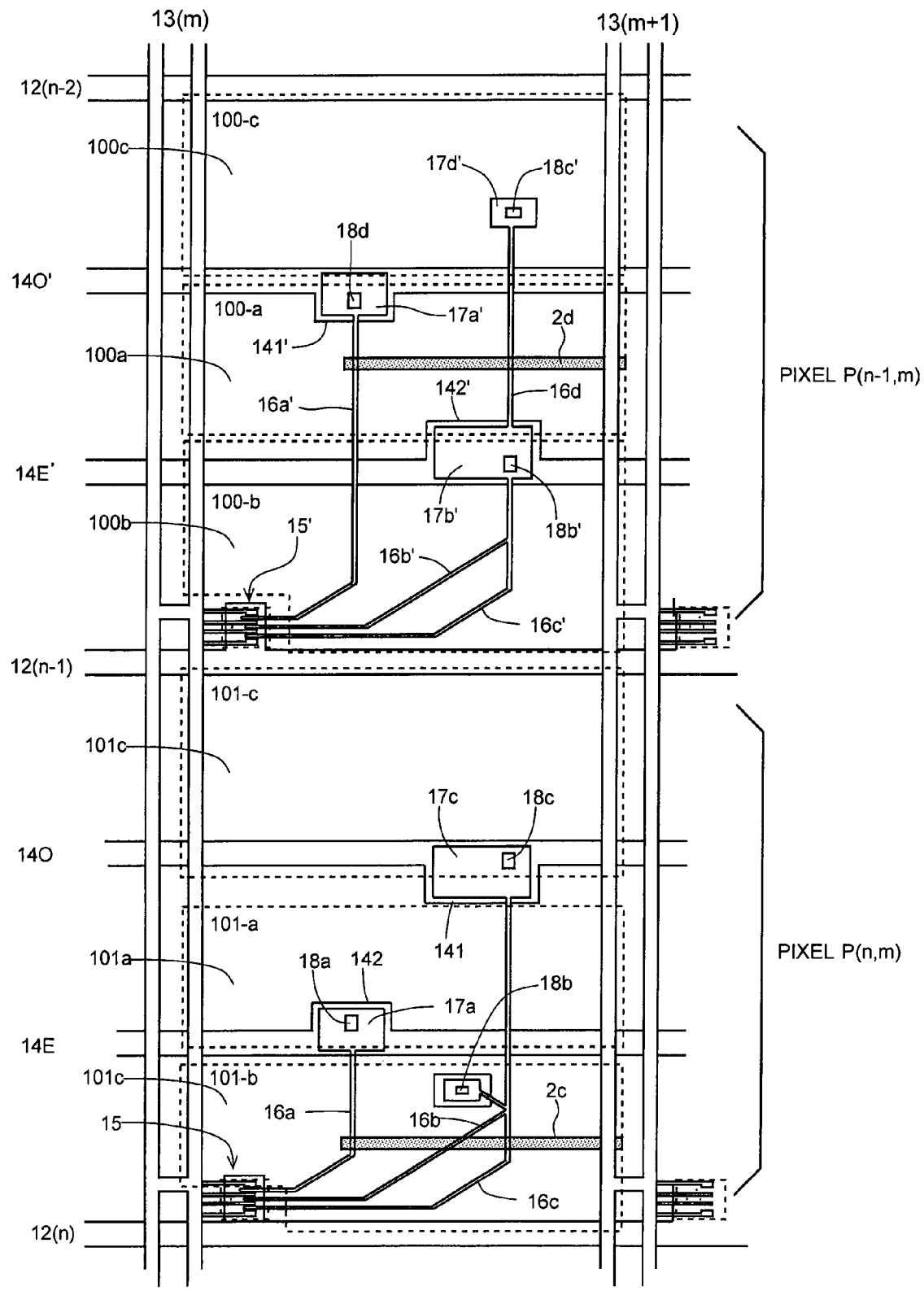
FIG. 11 A plan view showing another example of the active matrix substrate embodying the invention.

Next, a defect correcting method adopted in a case where the number of subpixels is three will be described. FIG. 11 is a plan view schematically showing the pixel structure of an active matrix substrate. A pixel P(n−1, m) and a pixel P(n, m) are next to each other in the column direction, and include subpixel electrodes 100a to 100c and subpixel electrodes 101a to 101c, respectively, arranged contiguously in the column direction. Scanning signal lines 12(n−1) and 12(n) are formed between the pixels in the horizontal direction in this figure, and data signal lines 13(m) and 13(m+1) are formed between the pixels in the vertical direction in this figure. Auxiliary capacitance conductors 14O and 14E are formed between the subpixel electrodes so as to be parallel to the scanning signal lines 12. A TFT 15 serving as a switching element is formed near the intersection of the scanning signal line 12 and the data signal line 13, and each pixel is provided with three TFTs 15.

In the pixel P(n, m), a drain electrode extension portion 16a extends from the TFT 15 to the auxiliary capacitance conductor 14E, and overlaps it to form a portion facing an auxiliary capacitance common electrode 142, which is an integral part of the auxiliary capacitance conductor 14E, via an insulating layer (not shown) and serving as an auxiliary capacitance electrode 17a. On this auxiliary capacitance electrode 17a, a contact hole 18a is formed, whereby the drain electrode extension portion 16a and the subpixel electrode 101a are connected to each other. Likewise, a drain electrode extension portion 16c crosses the auxiliary capacitance conductor 14E and reaches the auxiliary capacitance conductor 14O, and overlaps it to form a portion facing an auxiliary capacitance common electrode 141, which is an integral part of the auxiliary capacitance conductor 14O, via an insulating layer (not shown) and serving as an auxiliary capacitance electrode 17c. On this auxiliary capacitance electrode 17c, a contact hole 18c is formed, whereby the drain electrode extension portion 16c and the subpixel electrode 101c are connected to each other. On the other hand, a drain electrode extension portion 16b extends from the TFT 15, then comes into contact with the drain electrode extension portion 16c, and is then connected to the subpixel electrode 101b through a contact hole 18b.

A corrective connecting electrode 2c is formed in a layer including the scanning signal line 12(n). The corrective connecting electrode 2c overlaps the drain electrode extension portions 16a to 16c via the insulating layer, and overlaps the data signal line 13(m+1) via the insulating layer.

On the other hand, in the pixel P(n−1, m), a drain electrode extension portion 16a' extending from the TFT 15' crosses the auxiliary capacitance conductor 14E' and reaches the auxiliary capacitance conductor 14O', and overlaps it to form a portion facing an auxiliary capacitance common electrode 141', which is an integral part of the auxiliary capacitance conductor 14O', via an insulating layer (not shown) and serving as an auxiliary capacitance electrode 17a'. On this auxiliary capacitance electrode 17a', a contact hole 18a' is formed, whereby the drain electrode extension portion 16a' and the subpixel electrode 100a are connected to each other. Drain electrode extension portions 16b' and 16c' are connected together on their way to the auxiliary capacitance conductor 14E', and overlap it to form a portion facing an auxiliary capacitance common electrode 142', which is an integral part of the auxiliary capacitance conductor 14E', via an insulating layer (not shown) and serving as an auxiliary capacitance electrode 17b'. On this auxiliary capacitance electrode 17b', a contact hole 18b' is formed, whereby the drain electrode extension portions 16b' and 16c' and the subpixel electrode 100b are connected to each other. Furthermore, a drain electrode extension portion 16d extends from the auxiliary capacitance electrode 17b', crosses the auxiliary capacitance conductor 14O', and reaches the subpixel electrode 100c, where it is connected to the subpixel electrode 100c through a contact hole 18c'.

Voltage control of the subpixel electrodes will be described, taking up the pixel P(n, m) as an example. The same effective voltage is applied to the subpixel electrodes 101b and 101c. In addition, as described above, different auxiliary capacitance common voltages are fed to the two auxiliary capacitance conductors 14O and 14E. This makes the effective voltage of the subpixel electrode 101a higher than those of the subpixel electrodes 101b and 101c, and makes the brightness of the subpixel 101-a higher than those of the subpixels 101-b and 101-c. This makes it possible to eliminate unnaturalness in a rectilinear pattern image when it is displayed, and to reduce the dependence of γ characteristics on a viewing angle.

In the active matrix substrate configured as described above, if a pixel defect occurs as a result of source-drain leakage due to foreign particles, film residues, or the like, in the TFT 15 of the pixel P(n, m), the pixel defect is corrected by applying a drain voltage from the next pixel P(n−1, m) to part of the subpixels of the pixel P(n, m).

Figure 12:
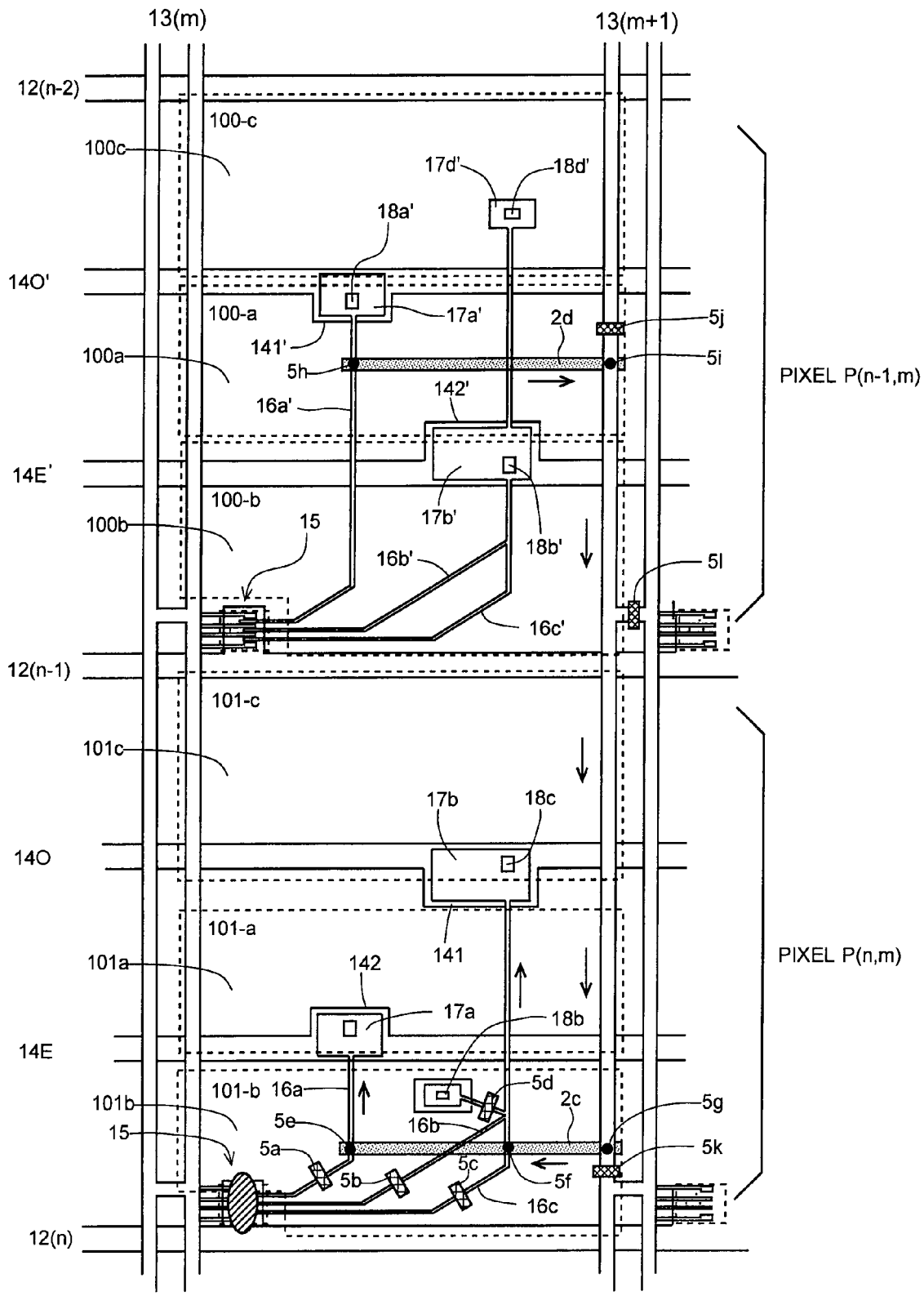
FIG. 12 A plan view showing an example of correction made to the substrate shown in FIG. 11.

FIG. 12 shows an example of a correcting method. The exemplary correcting method shown in FIG. 12 is performed in such a way that a drain voltage is applied from the subpixel electrode (a "bright" electrode) 100a of the pixel P(n−1, m) arranged above the defective pixel P(n, m) to the subpixel electrodes 101a and 101c of the defective pixel P(n, m) to drive the subpixels, and the other subpixel 101-b of the defective pixel P(n, m) is left as a black point. Specifically, correction is performed as follows.

Laser target portions 5a to 5c of the drain electrode extension portions 16a to 16c are irradiated with laser light so as to cut the electrode, thereby electrically disconnecting the TFT 15 affected by abnormalities from the subpixel electrodes 101a to 101c. Likewise, a laser target portion 5d laid between a portion where the drain electrode extension portions 16b and 16c are connected together and the contact hole 18b is irradiated with laser light so as to cut the electrode, thereby de-energizing the drain electrode extension portions 16b and 16c. Then, laser target portions 5e to 5g are irradiated with laser light so as to melt the insulating layer (not shown), thereby establishing electrical connection between the drain electrode extension portions 16a and 16c and the corrective connecting electrode 2c and between the data signal line 13(m+1) and the corrective connecting electrode 2c (see FIG. 8).

Laser target portions 5h and 5i are irradiated with laser light, thereby establishing electrical connection between the drain electrode extension portion 16a' of the pixel P(n−1, m) and the corrective connecting electrode 2d and between the data signal line 13(m+1) and the corrective connecting electrode 2d. Then, laser target portions 5j to 5l are irradiated with laser light so as to separate part of the data signal line 13(m+1) and use the separated part of the data signal line 13(m+1) as a detour conductor. Also in this example, aforementioned examples of laser can be used.

As described above, by forming a detour shown in FIG. 12 (indicated by arrows in the figure), the drain voltage applied to the subpixel electrode 101a of the pixel P(n−1, m) is applied also to the subpixel electrodes 101a and 101c of the defective pixel P(n, m). As a result, the subpixels 101-a and 101-c are made to perform the same display operation as the subpixel 100-a, and is given substantially the same brightness as the subpixel 100-a. This helps greatly improve the display quality.

Figure 13:
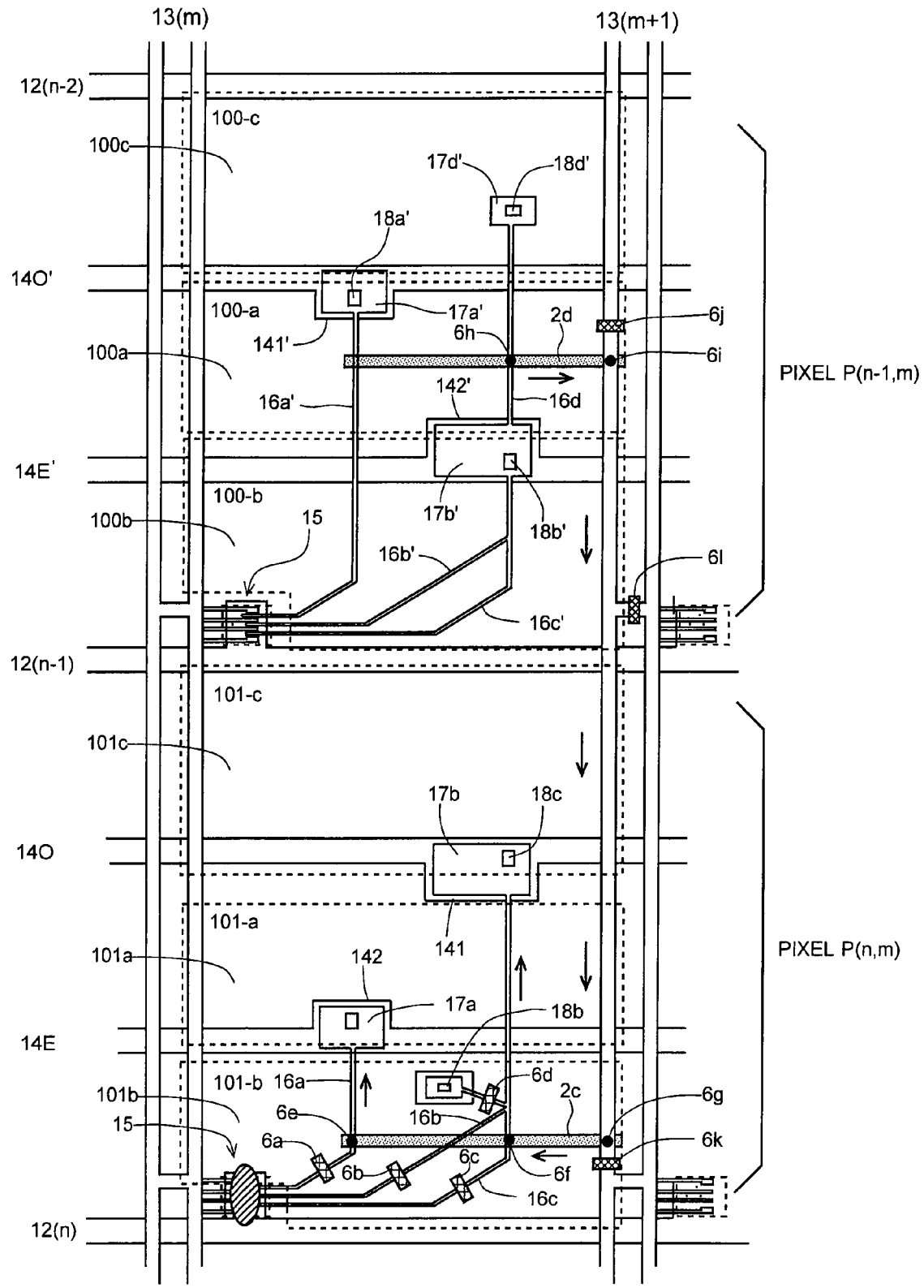
FIG. 13 A plan view showing another example of correction made to the substrate shown in FIG. 11.

FIG. 13 shows another example of a pixel correcting method. As is the case with the correcting method shown in FIG. 12, the correcting method shown in FIG. 13 is adopted when a pixel defect occurs due to source-drain leakage in the TFT portion of the pixel P(n, m); it differs from the correcting method shown in FIG. 12 in that the drain voltage is applied from the subpixel electrodes ("dark" electrodes) 100b and 100c of the pixel P(n−1, m) to the subpixels 101a and 101c of the defective pixel P(n, m).

The specific correction procedure is the same as that described above, and therefore only an outline thereof will be described. Laser target portions 6a to 6c of the drain electrode extension portions 16a to 16c of the pixel P(n, m) are irradiated with laser light so as to cut the electrode, thereby electrically disconnecting the TFT 15 affected by abnormalities from the subpixel electrodes 101a to 101c. Likewise, a laser target portion 6d laid between a portion where the drain electrode extension portions 16b and 16c are connected together and the contact hole 18b is irradiated with laser light so as to cut the electrode, thereby de-energizing the drain electrode extension portions 16b and 16c. Then, laser target portions 6e to 6g are irradiated with laser light so as to melt the insulating layer (not shown), thereby establishing electrical connection between the drain electrode extension portions 16a and 16c and the corrective connecting electrode 2c and between the data signal line 13(m+1) and the corrective connecting electrode 2c (see FIG. 8).

Laser target portions 6h and 6i are irradiated with laser light, thereby establishing electrical connection between the drain electrode extension portion 16d of the pixel P(n−1, m) and the corrective connecting electrode 2d and between the data signal line 13(m+1) and the corrective connecting electrode 2d. Then, laser target portions 6j to 6l are irradiated with laser light so as to separate part of the data signal line 13(m+1) and use the separated part of the data signal line 13(m+1) as a detour conductor.

As described above, by forming a detour shown in FIG. 13 (indicated by arrows in the figure), the drain voltage applied to the subpixel electrodes 100b and 100c of the pixel P(n−1, m) is applied also to the subpixel electrodes 101a and 101c of the defective pixel P(n, m). As a result, the subpixels 101-a and 101-c are made to perform the same display operation as the subpixels 100-b and 100-c, and are given substantially the same brightness as the subpixels 100-b and 100-c. This helps improve the display quality. As is the case where the number of subpixels is two, in a case where the number of subpixels is three, as compared with when the drain voltage at a lower effective voltage side of the next pixel is applied to the subpixel electrode of the defective pixel, when the drain voltage at a higher effective voltage side of the next pixel is applied thereto, better display quality is obtained. As described above, it is preferable to form a projection (an identification mark) 131 in the substrate for easy identification of a subpixel electrode to which the highest effective voltage is applied.

INDUSTRIAL APPLICABILITY

With an active matrix substrate of the present invention, it is possible to easily and reliably correct a pixel defect caused by abnormalities such as source-drain leakage or source-gate leakage in a TFT portion without reducing the aperture ratio, and to improve yields of liquid crystal display devices. Furthermore, with a correcting method for an active matrix substrate of the present invention, as compared with when all the subpixels of the defective pixel are corrected, it is possible to improve the display quality.

The invention claimed is:

1. An active matrix substrate comprising:
a plurality of scanning signal lines and data signal lines formed on the substrate;
thin-film transistors provided at intersections of the signal lines, the thin-film transistors each comprising a gate electrode connected to the scanning signal line and comprising a source electrode connected to the data signal line; and
pixel electrodes each connected to a drain electrode or a drain lead-out conductor of one of the thin-film transistors,
wherein the pixel electrodes, each comprise two or more subpixel electrodes to which different voltages can be applied,
wherein the data signal lines each comprise at least partially a double-track structure,
wherein a corrective connecting electrode is formed in a layer including the scanning signal line,
wherein part of the corrective connecting electrode overlaps the data signal line via an insulating layer, and another part thereof overlaps the drain electrode or the drain lead-out conductor via an insulating layer.

2. The active matrix substrate of claim 1, wherein
an identification mark for identifying a subpixel electrode of the two or more subpixel electrodes, the subpixel electrode to which a highest effective voltage is applied, is formed in the scanning signal line or in the data signal line within an area surrounded by lines of a double track of the data signal line.

3. The active matrix substrate of claim 2, wherein
the identification mark is a projection extending from the scanning signal line or the data signal line in a same plane.

4. A pixel defect correcting method for correcting a pixel defect occurring in an active matrix substrate, the active matrix substrate comprising;
a plurality of scanning signal lines and data signal lines formed on the substrate;
thin-film transistors provided at intersections of the signal lines, the thin-film transistors each comprising a gate electrode connected to the scanning signal line and comprising a source electrode connected to the data signal line;
pixel electrodes each connected to a drain electrode or a drain lead-out conductor of one of the thin-film transistors, the pixel electrodes each comprise two or more subpixel electrodes to which different voltages can be applied;
wherein the data signal lines each comprise at least partially a double-track structure;
wherein a corrective connecting electrode is formed in a layer including the scaning signal line;
wherein part of the corrective connecting electrode overlaps the data signal line via an insulating layer, and another part thereof overlaps the drain electrode or the drain lead-out conductor via an insulating layer;
the method comprising;
making at least one subpixel electrode of a defective pixel and a subpixel electrode of a pixel next to the defective pixel, to be at approximately a same potential by establishing electrical connection therebetween via the data signal line and the corrective connecting electrode, and another subpixel of the defective pixel is left as a black point.

5. A pixel defect correcting method according to claim 4, wherein at least one subpixel electrode of a defective pixel and a subpixel electrode of a pixel next to the defective pixel are made to be at approximately a same potential by establishing electrical connection therebetween, the subpixel next to the defective pixel being the subpixel electrode to which a highest effective voltage is applied.

6. A pixel defect correcting method, according to claim 4, wherein a portion where the corrective connecting electrode and the data signal line overlap each other and a portion where the corrective connecting electrode and the drain electrode or the drain lead-out conductor overlap each other are melted by laser irradiation so as to establish electrical connection therebetween.

7. A pixel defect correcting method according to claim 4, further comprising:

separating part of the data signal line electrically connected to the corrective connecting electrode from a remainder of the data signal line.

* * * * *